(12) United States Patent
Thieme

(10) Patent No.: US 8,142,881 B2
(45) Date of Patent: Mar. 27, 2012

(54) MESH-TYPE STABILIZER FOR FILAMENTARY COATED SUPERCONDUCTORS

(75) Inventor: Cornelis Leo Hans Thieme, Westborough, MA (US)

(73) Assignee: American Superconductor Corporation, Devens, MA (US)

( * ) Notice: Subject to any disclaimer, the term of this patent is extended or adjusted under 35 U.S.C. 154(b) by 0 days.

(21) Appl. No.: 12/844,233

(22) Filed: Jul. 27, 2010

(65) Prior Publication Data
US 2011/0045986 A1 Feb. 24, 2011

Related U.S. Application Data

(63) Continuation of application No. 11/394,917, filed on Mar. 31, 2006, now Pat. No. 7,763,343.

(60) Provisional application No. 60/667,001, filed on Mar. 31, 2005.

(51) Int. Cl.
*H01L 39/02* (2006.01)
*H01L 39/24* (2006.01)

(52) U.S. Cl. ......... 428/195.1; 29/599; 361/19; 505/100; 505/125; 505/231; 505/300; 505/431; 505/434; 505/461; 428/35.3; 174/125.1

(58) Field of Classification Search ............... 428/195.1, 428/35.3; 361/19; 505/100, 125, 231, 300, 505/431, 434, 461; 29/599; 174/125.1; 448/6, 7, 9–13, 31, 43
See application file for complete search history.

(56) References Cited

U.S. PATENT DOCUMENTS

| | | | |
|---|---|---|---|
| 3,327,866 | A | 6/1967 | Pall et al. |
| 4,187,391 | A | 2/1980 | Voser |
| 4,403,653 | A | 9/1983 | Davidson |
| 5,209,964 | A | 5/1993 | Nakagawa |
| 5,231,074 | A | 7/1993 | Cima et al. |
| 5,439,586 | A | 8/1995 | Richards et al. |
| 6,022,832 | A | 2/2000 | Fritzemeier et al. |
| 6,027,564 | A | 2/2000 | Fritzemeier et al. |
| 6,190,752 | B1 | 2/2001 | Do et al. |
| 6,436,317 | B1 | 8/2002 | Malozemoff et al. |
| 6,475,935 | B1 | 11/2002 | Ishizaki et al. |

(Continued)

FOREIGN PATENT DOCUMENTS

DE 10226390 1/2004

(Continued)

OTHER PUBLICATIONS

U.S. Appl. No. 60/166,297, filed Nov. 18, 1999, Fritzemeier.

(Continued)

*Primary Examiner* — Betelhem Shewareged
*Assistant Examiner* — Sathavaram I Reddy
(74) *Attorney, Agent, or Firm* — Occhiuti Rohlicek & Tsao LLP

(57) ABSTRACT

A superconductor for mitigating the effects of local current disruptions in a superconducting filament. The superconductor comprises superconducting filaments covered by a medium in electrical communication with the filaments. The covering medium has anisotropic conductivity, the conductivity in a direction substantially aligned with the filaments being selected to stabilize the superconductor near the critical temperature, and the conductivity of the covering in a direction substantially perpendicular to the filaments being selected to permit controlled current sharing between the filaments, especially when a filament is compromised, while simultaneously limiting alternating current (ac) losses. In various embodiments, the covering comprises a wire mesh having longitudinal wires made of a first material having a first conductivity, and transverse wires made of a second material having a second conductivity, different from the first conductivity.

10 Claims, 5 Drawing Sheets

U.S. PATENT DOCUMENTS

| | | | |
|---|---|---|---|
| 6,475,958 | B1 | 11/2002 | Paul et al. |
| 6,762,673 | B1 | 7/2004 | Otto et al. |
| 6,797,313 | B2 | 9/2004 | Fritzemeier et al. |
| 6,974,501 | B1 | 12/2005 | Zhang et al. |
| 7,285,843 | B2 | 10/2007 | Arakawa et al. |
| 2001/0015880 | A1 | 8/2001 | Heismann et al. |
| 2002/0144838 | A1 | 10/2002 | Fritzemeier et al. |
| 2005/0014429 | A1 | 1/2005 | Tueshaus et al. |
| 2005/0065035 | A1 | 3/2005 | Rupich et al. |
| 2006/0040830 | A1 | 2/2006 | Thieme et al. |
| 2006/0073975 | A1 | 4/2006 | Thieme et al. |
| 2006/0073979 | A1 | 4/2006 | Thieme et al. |

FOREIGN PATENT DOCUMENTS

| | | |
|---|---|---|
| WO | 98/58415 | 12/1998 |
| WO | 99/16941 | 4/1999 |
| WO | 99/17307 | 4/1999 |
| WO | 00/58044 | 10/2000 |
| WO | 00/58530 | 10/2000 |
| WO | 01/08169 | 2/2001 |
| WO | 01/08170 | 2/2001 |
| WO | 01/08231 | 2/2001 |
| WO | 01/08232 | 2/2001 |
| WO | 01/08233 | 2/2001 |
| WO | 01/08235 | 2/2001 |
| WO | 01/08236 | 2/2001 |
| WO | 01/11428 | 2/2001 |
| WO | 01/15245 | 3/2001 |
| WO | 01/26164 | 4/2001 |
| WO | 01/26165 | 4/2001 |
| WO | 02/35615 | 5/2002 |

OTHER PUBLICATIONS

U.S. Appl. No. 60/308,957, filed Jul. 31, 2001, Fritzemeier.
U.S. Appl. No. 60/309,116, filed Jul. 31, 2001, Fritzemeier et al.
http://www.8886.co.uk/ref/resistivity_values.htm (Feb. 2, 2009).
http://www.eddy-current.com/condres.htm (Feb. 3, 2009).
U.S. Appl. No. 60/477,613, filed Jun. 10, 2003, Rupich et al.
American Superconductor Corporation, Oak Ridge National Laboratory, SuperHyPE Program Review, The Defense Advanced Research Projects Agency, DARPA 2004 STTR Topic ST041-002, "Low Cost Fabrication of 2G Wire for AC Applications", Jan. 10, 2005.
American Superconductor Corporation, "HTS Wire, HTS Fault Current Limiters", http://www.amsuper.com/products.htsWire/FaultCurrentLimiters.cfm, Mar. 3, 2005, 2 pages.
Beach, D. et al., "Sol-Gel Synthesis of Rare Earth Aluminate Films as Buffer Layers for High Tc Superconducting Films", *Mat. Res. Soc. Symph. Proc.*, vol. 495, pp. 263-270, 1988.
Brockenborough et al., "The Status of Applications for High-Tc Superconducting Wire", 2 pages.
Chapter 4: Fault-Current Limiters, 11 pages, published Sep. 1997; *WTEC Hyper-Librarian* (www.wtec.org/loyola/scpc/foot1#foot1).
"Demonstration of a Superconducting Fault Current Limited", *Transmission Substations*, Aug. 2003, 2 pages.
Derwent World Patent Index, English Abstract for DE 10226390, Dialog File Number 351, Accession Number 13911300.
European Patent Office, International Search Report for PCT/US2006/012385 mailed Oct. 2, 2006, 4 pages.
Kalsi, S., "Resistive High Temperature Superconductor Fault Current Limited", presented at SCENET/IEA Workshop, Grenoble, France, Mar. 16, 2004, 20 pages.
Lee, D.J. et al., "Alternative Buffer Architectures for High Critical Current Density YBCO Superconducting Deposits on Rolling Assisted Biaxially-Textured Substrates", *Japanese J. Appl. Phys.*, vol. 38, L178-L180, Feb. 15, 1999.
Malozemoff, A.P., "Second Generation HTS Wire: An Assessment", *American Superconductor Corporation*, pp. 1-15, Dec. 2004.
Paranthaman, M. et al., "Growth of biaxially textured RE2O3 buffer layers on rolled-Ni substrates using reactive evaporation for HTS-coated conductors," *Superconductor Sci. Tech.*, vol. 12, pp. 319-325, 1999.
Rupich, M.W. et al., "Growth and Characterization of Oxide Buffer Layers for YBCO Coated Conductors", *I.E.E.E. Trans. on Appl. Supercon.*, vol. 9, No. 2, pp. 1527-1530, Jun. 1999.
Shoup, S.S. et al., "Epitaxial Thin Film Growth of Lanthanum and Neodymium Aluminate Films on Roll-Textured Nickel Using a Sol-Gel Method", *J. Am. Cer. Soc.*, vol. 81, pp. 3019-3021, 1998.

MESH-TYPE STABILIZER FOR FILAMENTARY COATED SUPERCONDUCTORS

CROSS REFERENCE TO RELATED APPLICATIONS

This application is a continuation of U.S. application Ser. No. 11/394,917 filed on Mar. 31, 2006 (now U.S. Pat. No. 7,763,343, Issued Jul. 27, 2010), which claims the benefit of U.S. Provisional Application No. 60/667,001 filed on Mar. 31, 2005, the contents of which are incorporated herein by reference.

GOVERNMENTAL RIGHTS

This invention was made with support from Air Force Contract Number FA9550-05-C-0001. The United States Government may have certain rights to this invention.

BACKGROUND

1. Field of the Invention

This invention relates to filamentary multilayer superconductor articles. The invention also relates to superconductor articles suitable for use in alternating current (ac).

2. Background of the Invention

Since the discovery of high-temperature superconducting (HTS) materials (superconducting above the liquid nitrogen temperature of 77 K) there have been efforts to develop various engineering applications using such HTS materials. In thin film superconductor devices and wires, significant progress has been made with fabrication of devices utilizing an oxide superconductor including yttrium, barium, copper and oxygen in the well-known basic composition of $YBa_2Cu_3O_{7-x}$ (hereinafter referred to as "YBCO"). Biaxially textured superconducting metal oxides, such as YBCO, have achieved high critical current densities in a coated conductor architecture, often referred to as second generation HTS wires, or a "coated conductor." The expression "HTS wire" indicates a HTS conductor with the attributes that make it useful for the construction of a superconducting device; its cross-sectional geometry can vary from tape-like to round.

Typically, second generation HTS wires 10 include a metal substrate 11, buffer layer(s) 12, and an active layer 13, e.g., a superconductor, as illustrated in FIG. 1. The metal substrate, such as Ni, Ag, or Ni alloys, provides flexibility for the article and can be fabricated over long lengths and large areas. The buffer layer(s) consists of metal oxide layers, such as $LaAlO_3$, $Y_2O_3$, $CeO_2$, or yttria-stabilized zirconia (YSZ); it makes up the next layer and serves as a chemical barrier layer between the metal substrate and the active layer. The buffer layer(s) reduces oxidation of the substrate and also reduces the diffusion of chemical species between the substrate and the superconductor layer. Moreover, the buffer layer(s) can have a coefficient of thermal expansion that is well matched with the superconductor material.

To achieve high critical current densities in the wire, the superconducting material has a sharp biaxial texture. As used herein, "biaxially textured" refers to a surface for which the crystal grains are in close alignment with a direction in the plane of the surface and a direction perpendicular to the surface. One type of biaxially textured surface is a cube textured surface, in which the crystal grains are also in close alignment with a direction perpendicular to the surface. Cube textured metal foils such as Ni or Ni alloys can serve as a substrate and texture template for high quality HTS wires.

When using a cube textured substrate the buffer layer is an epitaxial layer, that is, its crystallographic orientation is directly related to the crystallographic orientation of the substrate surface onto which the buffer layer is deposited. For example, in a multi-layer superconductor having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer.

Second generation HTS wire can be incorporated into a variety of devices for many applications, including cables, motors, generators, synchronous condensers, transformers, current limiters, and magnet systems. The incorporation of second generation superconducting YBCO wires into such devices provides the opportunity to dramatically reduce the device cooling requirements, thus enabling the development of lightweight, compact, high-power sources. Currently a wide, e.g., several millimeters, tape configuration is used to reach practical electrical currents.

Many potential applications for HTS wires involve operating the superconductor in the presence of ramped magnetic or oscillating magnetic fields, or require that the HTS wire carry alternating current. In the presence of time-varying magnetic fields or currents, there are a variety of mechanisms that give rise to energy dissipation, hereinafter referred to as "ac losses." Although second generation HTS wire is currently suitable for many types of electric power devices, the ac losses from the current HTS wires are too high for use in demanding HTS applications in which the alternating magnetic fields have a higher amplitude or frequency. The use of an HTS wire with greatly reduced ac losses would enhance the application of these wires in a great variety of novel, HTS-based devices.

There are a number of factors contributing to the total ac loss in a superconducting wire, such as superconducting properties and dimensions of the superconducting oxide film, and the electrical and magnetic properties of the metal constituents of the conductor. A major contributor to the ac losses is so-called hysteretic losses in the superconducting oxide film caused by an oscillating external magnetic field. This loss contribution is proportional to the film width as seen by the magnetic field direction, and is therefore greatest when the magnetic field is perpendicular to the film surface, or when the alternating magnetic field has a large perpendicular component. For current HTS superconductor widths even a moderate ac frequency and magnetic field perpendicular to the superconducting film plane can produce very large ac losses. It has been proposed to divide an oxide superconducting film into narrow filaments to suppress ac loss in a superconducting oxide thin film.

FIG. 2 is a perspective view of a portion of a coated conductor article in which the superconducting film is arranged as a thin filament array. The multilayer article 20 includes a metal substrate 21 having a textured surface and epitaxially grown buffer layer(s) 22. Such textured bases have been previously described. A RABiTS™ (rolling-assisted, biaxially textured substrates) textured template is typically used. A RABiTS™ substrate is a roll-textured and annealed metal tape, e.g., nickel or nickel alloy such as NiW with a sharp cube texture, covered in an epitaxial manner with one or more oxide or metal buffer or conditioning layers. Another variation used to prepare the textured template is ion beam assisted deposition or IBAD. The resulting textured base serves as a template for the HTS compound, e.g., yttrium-barium-copper-oxide (YBCO). Superconductor filaments 23 run substantially continuously along the length of the base to form an array of substantially parallel filaments. The superconducting filaments are crystallographically oriented and typically exhibit biaxial texture.

Short sample testing of a superconductor article patterned into multiple filaments shows a reduction in ac loss proportional to the reduction in conductor or filament width when exposed to an alternating magnetic field with a perpendicular field component. In principle the filaments can be electrically isolated from each other and the absence of a conductive path would strongly reduce so-called interfilamentary coupling losses.

Second generation HTS wire production is based on a variety of continuous reel-to-reel thin film deposition techniques, practiced over very long lengths as superconducting wires are needed in piece lengths that can reach 1000 meters. Small defects can locally disrupt current transfer, and their effect becomes more serious when the conductor width is reduced. In narrow filaments of, for example, 100 micrometer width, small defects can potentially seriously disrupt local current transfer and render the conductor useless when used in long lengths. A certain degree of current sharing capability between filaments is therefore desired to mitigate the effect of these small defects, allowing currents an alternative path in case of an occasional local current constriction.

SUMMARY OF THE INVENTION

In one aspect, the present invention provides a means for mitigating the effects of local current disruptions in a superconducting filament that can include current sharing among filaments, while maintaining the advantages of reduced ac losses associated with filamentized wires. In one aspect, the present invention provides superconducting filaments that are covered by a medium that is in electrical communication with the filaments and has anisotropic conductivity. In various embodiments, the resistivity of the covering in a direction substantially aligned with the filaments is selected to stabilize the superconductor near the critical temperature, and the resistivity of the covering in a direction substantially perpendicular to the filaments is selected to permit controlled current sharing between the filaments, especially in the situation when a filament is compromised, while simultaneously limiting alternating current (ac) losses.

In preferred embodiments, the covering includes a wire grid or a mesh that can be woven and can have an open area of between 10% and 90% of the surface. The mesh can have longitudinally disposed mesh wires that are in electrical communication with the filaments, and disposed above the filaments, and transversely disposed mesh wires. The wires can have a diameter of between 0.02 millimeters and 0.05 millimeters. In various embodiments, the longitudinally disposed wires include a material that is different from, and of higher conductivity than the material included in the transversely disposed wires. Suitable materials for the longitudinal wires include copper, a copper alloy, silver, a silver alloy, a noble metal, and combinations thereof. Suitable materials for the transversely disposed wires include stainless steel, a nickel alloy, a copper alloy, and aluminum alloy, and combinations thereof. In some embodiments, the resistivity of the longitudinal wires is in the range of 2-20 nΩm, and preferably 2 nΩm, at a temperature of 77 degrees K, and the resistivity of the transverse wires is in the range 200-1200 nΩm, and preferably 740 nΩm, at a temperature of 77 degrees K. In some embodiments, the resistivity of the material in the transverse wires is about 40 times the resistivity of the material in the longitudinal wires.

In various embodiments, a cap layer, preferably including a noble metal, is disposed upon the superconducting filaments. In further embodiments, an adhesive layer, preferably including solder, is disposed between the covering and the superconducting filaments.

In another embodiment, the present invention provides a fault current limiter in which a superconductor covering includes longitudinal wires that conduct a controlled and limited current in the event of a fault in a circuit that includes the superconductor, and transverse wires that have a thermal conductivity selected to effectively transport heat away from the longitudinal wires in the event of a fault. The longitudinal wires can include stainless steel, a nickel alloy, a copper alloy, an aluminum alloy, and combinations thereof, and the transverse wires can include copper, aluminum, silver, a nickel alloy, a copper alloy, an aluminum alloy, a silver alloy, and combinations thereof.

In another aspect, the present invention provides a current limiter that includes a single superconducting layer and/or a set of superconducting filaments, and a covering over the superconductor that has anisotropic resistivity. The covering can include a mesh that can have longitudinal wires aligned with, and in electrical communication with, the superconductor, and transversely disposed wires. The wires can have a diameter in the range 0.02-0.25 millimeters. The longitudinal wires can be made of stainless steel, a nickel alloy, a copper alloy, an aluminum alloy, and combinations thereof, and have a resistivity in the range 100-1500 nΩm, and the transverse wires can be made of copper, aluminum, silver, a nickel alloy, a copper alloy, an aluminum alloy, a noble metal alloy, and can have a thermal conductivity of at least 1000 W/m-K at a temperature of 77 degrees Kelvin. In preferred embodiments, the resistivity of the material included in the longitudinal wires is selected to carry a controlled and limited current along the longitudinally disposed wires in the event of a fault in a circuit that includes the superconducting layer, and the thermal conductivity of the material included in the transverse wires is selected to effectively transport heat away from the longitudinally disposed wires in the event of a fault.

BRIEF DESCRIPTION OF THE DRAWINGS

The invention is described with reference to the following figures, which are presented for the purpose of illustration only and which are not intended to be limiting of the invention and in which like elements are indicated by the like numbers in all the figures.

DETAILED DESCRIPTION

Figure 1:
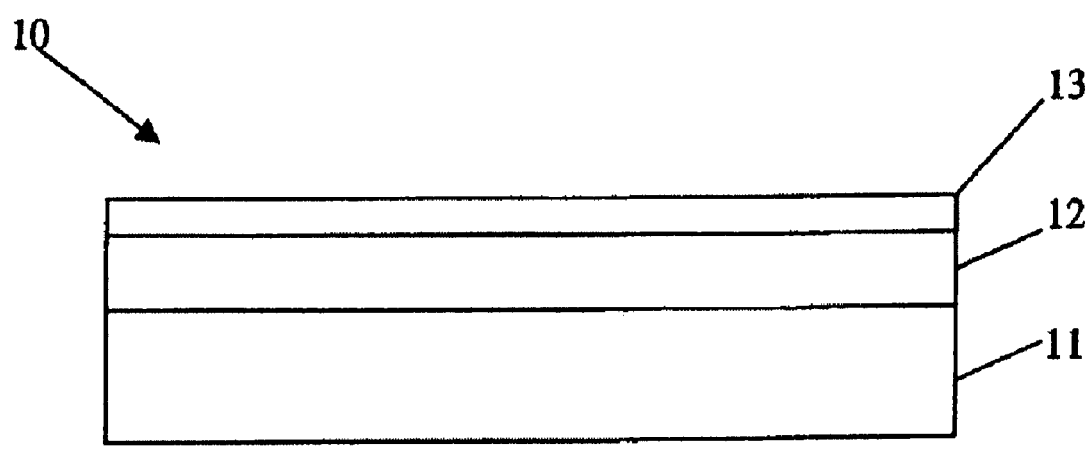
FIG. 1 is a cross-sectional view of a typical superconductor article.
Figure 2:
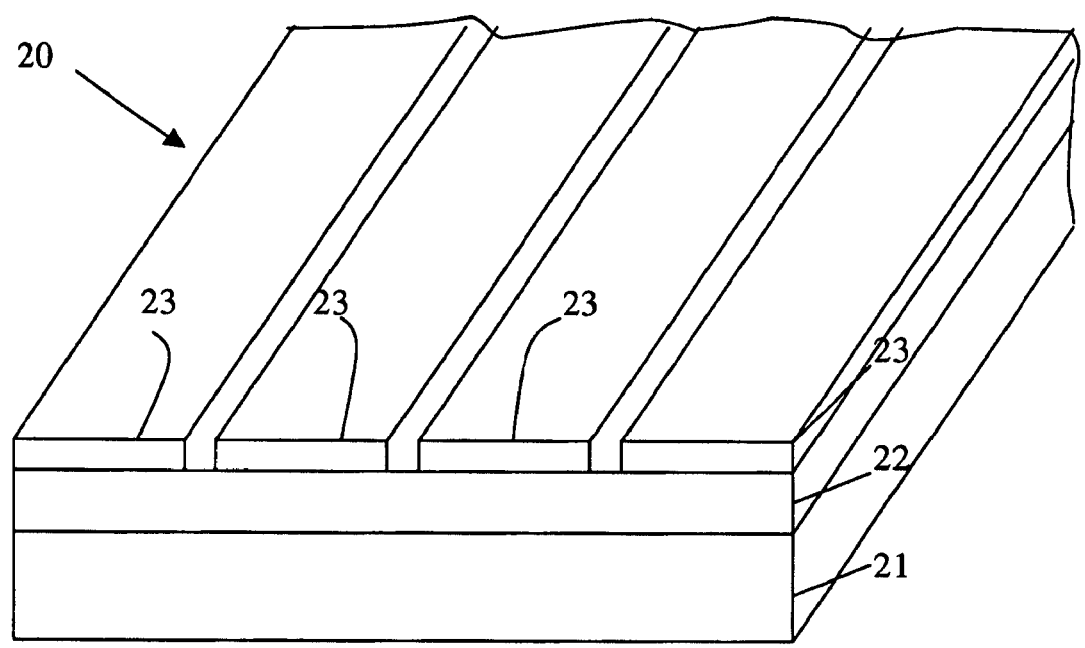
FIG. 2 is a perspective view of a filamentary coated superconductor.

Second generation HTS wires that are manufactured using reel-to-reel thin film deposition techniques can attain considerable lengths. As the length of an individual segment of wire increases, the probability of a current-disrupting defect somewhere along the length of the wire increases. Localized current disruption may be caused by defects in the HTS layer, constrictions, thermal fluctuations, magnetic fields, electrical noise, or other causes of a local critical current depression in the superconducting layer. Therefore, the utility of second generation HTS wires is greatly enhanced by electrically stabilizing the wire to permit the bypassing of localized defects through an alternative electrically conductive pathway disposed along the length of the superconducting filament and in electrical contact with it. Previous techniques for stabilizing monolith HTS superconductor wires having a width of about 4 millimeters have made use of a sheet or layer of conducting material placed on top of the wires.

In the case of narrow filaments of, for example, 100 micrometer width, the effects of localized defects are exacerbated since there are fewer alternate paths for the current flow within the filament. The cumulative effect of such defects can render the filament useless, especially for longer piece lengths of the order of 1000 meters in length. Stabilization of filaments with a conducting sheet or layer suitable for monolith HTS wires may not be suitable for filamentized HTS wires, since the conductive sheet would span adjacent filaments resulting in strong filament current coupling. The resultant hysteretic losses induced in such an arrangement can be as large as those associated with an unstriated conductor.

In some situations, it is desirable to allow a certain degree of current sharing (or "cross talk") between a filament and other, assisting filaments to mitigate the effect of local defects in a filament, or local filament quenching due to local thermal, magnetic or electrical disturbances. Since the superconductors are usually operated at a fraction of the critical current, such current sharing does not, in general, cause these assisting filaments to exceed the critical current and become non-superconducting, or "normal" conductors. Since any current flowing from filament to filament is flowing through a normal conductor, it is associated with an ac loss. It is desirable to control these losses so as to keep them to a minimum. Acceptably low losses can be achieved by selecting a high resistivity stabilizer that covers some or all of the filaments.

There is therefore a need for a high conductivity stabilizer in the longitudinal direction and a low conductivity stabilizer in the transverse direction. Embodiments of the present invention address this need by providing an anisotropically conducting covering that covers substantially all of the HTS filaments, and is in electrical communication with the filaments. The covering can act as an electrical stabilizer. In one approach, an anisotropic metal foil can be used. Examples include foils consisting of two metals, such as Cu and Nb that are elements with very limited miscibility that can readily be cast as a binary mixture and then extruded and rolled into a foil having different properties in two directions. Another example is a stainless steel billet having rows of parallel drilled holes into which high conductivity copper or aluminum rods are placed. Such a billet can be extruded and rolled into a foil having greatly differing conductivities in the length direction and in the transverse direction. The stabilizer desirably comprises an anisotropic medium having high conductivity elements that are not wider than an individual filament.

While the following description refers to the stabilization of specific examples of HTS superconductors, embodiments of the invention are not limited to these superconductors and may be used with any kind of second generation superconducting wire. Preferred coverings of the invention combine a low resistivity in the longitudinal direction aligned with the superconducting filaments and a higher resistivity in the transverse direction perpendicular to the filaments. The low resistivity of the covering in the longitudinal direction provides effective stabilization of each individual filament by providing a highly conducting alternative current path in the region of localized defects in a filament. The higher resistivity of the covering in the direction perpendicular to the filaments limits hysteretic losses while still providing adequate shunting stabilization.

Figure 3:
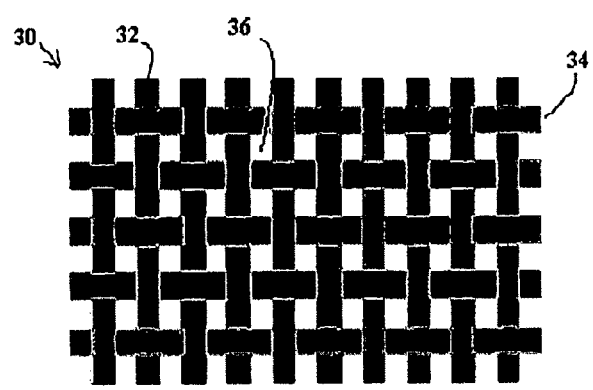
FIG. 3 is a top view of a mesh-type covering according to one or more embodiments of the present invention.

The following description refers to a mesh-type embodiment of an electrically stabilizing covering for a filamentary coated superconductor however, the invention is not limited to meshes. Any form of covering having a suitable anisotropic conductivity may be used. As shown in FIG. 3, in a preferred embodiment of the present invention, a mesh 30 having anisotropic resistivity that covers the superconducting filaments is provided. In one aspect of the invention, the mesh is a wire mesh in which the longitudinal mesh wires 32 and the transverse mesh wires 34 are made of different materials. In a preferred embodiment, the longitudinal mesh wire 32 is made of copper. Other low resistivity materials such as, aluminum, silver, oxide dispersion strengthened copper, certain copper-beryllium alloys and copper-silver alloys, and combinations thereof may be used for the longitudinal mesh wire. In some embodiments, the resistivity of the longitudinal mesh wire is in the range of 2 $n\Omega m$ to 20 $n\Omega m$ at 77K, and lower at temperatures below 77K. The term "low resistivity" as used herein refers to a resistivity in the range of 2 $n\Omega m$ to 20 $n\Omega m$ at 77K. The resistivity is selected to be low enough to provide efficient stabilization of the superconducting filaments in the region of localized defects, as referred to above. In other embodiments, the transverse mesh wire 34 is made of stainless steel, such as 304 or 316 stainless steel. For the transverse mesh wire material, alternative higher resistivity materials, such as copper-zinc alloys, copper-nickel alloys, nickel-20% chromium alloy, Inconel, Incoloy, and combinations thereof may be used. The resistivity of the transverse mesh wire material is preferably in the range of 200-1200 $n\Omega m$, about 100-600 times higher than the resistivity of the longitudinal mesh wire material. The term "high resistivity" as used herein refers to a resistivity in the range of 200 $n\Omega m$ to 1200 $n\Omega m$ at 77K. The resistivity of the transverse mesh wire material is selected to permit a carefully controlled degree of cross talk between the filaments, such that a viable alternative current path is provided to shunt a compromised filament, while simultaneously limiting hysteretic losses, especially magnetic and eddy current losses. These losses grow in inverse proportion to the resistivity of the transverse mesh wire material.

In a preferred embodiment, the mesh is woven, with the longitudinal mesh wires 32 comprising the warp, and the transverse mesh wires 34 comprising the weft. In various embodiments, the mesh 30 is woven using plain weave, twill, Dutch twill, or other types of weave common in the industry for mesh types that use only one metal. In other embodiments the covering is not woven, and can include a grid of wires, or one or more sets of wires that are overlaid on each other. The covering wires are preferably in electrical contact with each other at some or all of the locations where the stabilizer wires intersect. The diameters of the longitudinal and transverse wires can be the same or different. In a preferred embodiment, the diameters of the mesh wires 32 and/or 34 are about 0.05 mm, but higher mesh wire diameters can be used, and mesh wires having a diameter as low as about 0.025 mm can be used. In various embodiments, the diameters of the longitudinal mesh wires 32 and transverse mesh wires 34 range from about 0.025 mm to about 0.05 mm. In a preferred embodiment using 0.05 mm diameter mesh wires 32 and 34, the open area 36 of the mesh is in the range of 32-34%, but can be in the range 10-90% when smaller or larger diameter mesh wires are used, or when the weave is selected to produce a wider separation between mesh wires.

In some embodiments, the covering is in direct electrical communication with the superconducting filaments. In other embodiments, the covering is in indirect electrical communication with the superconducting filaments through a conductive protective or cap layer. The cap layer serves to protect the superconducting filament, by providing a physical and chemical barrier to the environment, and may be made of a noble metal, such as silver.

In some embodiments, the covering is affixed to the superconductor by a joining means, such as soldering, thermal bonding, or an adhesive or other bond. The joining means is preferably disposed on the cap layer, which in turn is disposed on the superconducting filament. The material used in the joining means may be a high resistivity solder or conducting polymer, and desirably has a relatively high resistivity in order to limit shunting between filaments and the associated filament coupling losses.

Preferably, the superconducting filaments comprise a layer disposed above a buffer layer, which in turn is a layer covering the surface of the substrate. The buffer layer can serve to act as a barrier to isolate the superconducting layer from the substrate. Exemplary buffer materials include metal oxides, and preferably textured metal oxides.

The superconducting filament comprises the HTS material, preferably YBCO.

Figure 4:
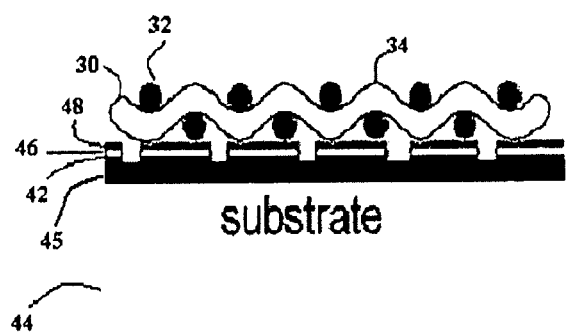
FIG. 4 is a cross-sectional view of a filamentary coated superconductor with mesh-type covering according to one or more embodiments of the present invention.

FIG. 4 shows a sectional view of the mesh 30 covering the superconducting filaments 42. In one embodiment, the filaments 42 are disposed on a substrate 44, with a buffer layer 45, a cap layer 46, and a layer of high resistivity solder 48 covering the filaments 42. The high resistivity solder 48 can serve to physically secure the stabilizer to the superconducting filaments, and can also provide electrical contact between the superconducting filament 42 and cap layer 46 and the longitudinal mesh wires 32 of the mesh 30. In a preferred embodiment, the spacing of the longitudinal mesh wires 32 is such that each mesh wire is disposed over a filament, i.e., with two longitudinal mesh wires 32 disposed on each filament, as illustrated in FIG. 4. Finer meshes can be used, with more than two longitudinal mesh wires disposed above each filament. A coarse mesh can also be used, with only a single longitudinal mesh wire aligned above each filament. It is desirable that the filament width, mesh wire thickness, and mesh count be selected so that the longitudinal mesh wire be disposed on top of and not between the filaments since the latter might result in unwanted shorting of the filaments. In an alternative embodiment, a thin stainless steel foil can be laminated to the filamentized conductor first, and the mesh soldered on top of the stainless steel foil. The presence of the stainless steel foil between the mesh and the capped superconducting filaments only marginally affects stability and losses.

The anisotropic mesh covering of the type described above with respect to stabilization of superconducting filaments can also be advantageously used as a fault current limiter (FCL). In a HTS-based FCL, a regular operating current maintains the superconducting state, but a fault condition in the circuit causes the current to exceed the critical current. When the design of the FCL calls for a dissipation of the current in the conductor, the normal metal component of the conductor carries the excess current while fault current is flowing. For example, a stainless steel laminate may be used. As the voltage builds up along the conductor during the fault, heat develops within the stainless steel. If the stainless steel is sufficiently thick, the heat development in the conductor can be adiabatic without damaging the conductor due to unacceptably high temperature rises. Such a thick conductor can be made, but may be unattractive since, when configured as a coil, heat exchange with the environment is limited by the poor conductivity of the stainless steel. Alternatively, if the conductor is in direct contact with a cooling medium, the stainless steel can be thin or even absent, but this layout can require a lot of space because it is not usually possible achieve a tightly wound coil configuration. In another arrangement, the conductor can be coiled with one side of the coil in contact with a cooling medium. In this situation, it is desirable to have a high resistivity normal conductor providing a resistive load to limit the fault current in the longitudinal direction, while also having good thermal conductivity in the transverse direction.

Figure 5:
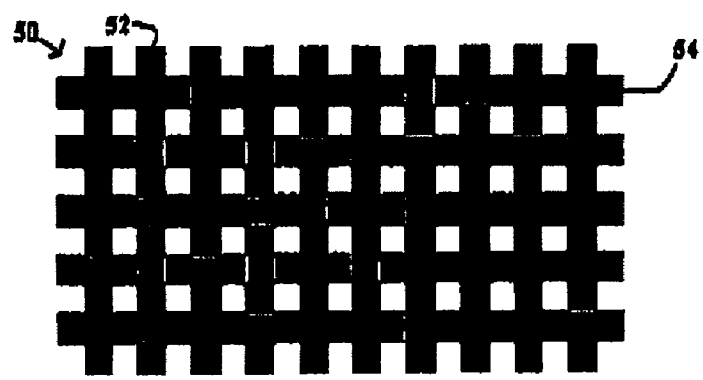
FIG. 5 is a top view of a mesh-type covering for use in a current limiter application according to one or more embodiments of the present invention.
Figure 6:
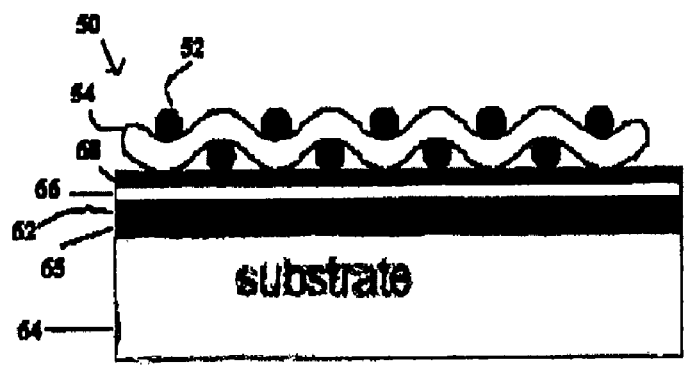
FIG. 6 is a cross-sectional view of a filamentary coated superconductor with a mesh-type covering for use in a current limiter application according to one or more embodiments of the present invention.

In one embodiment of the invention, the requirement for anisotropy in electrical and thermal properties of the stabilizer of a HTS-based FCL can be met by a covering comprising a mesh made of two different materials, for example, copper and stainless steel. In preferred embodiments of a FCL application of the invention, the conductor is an unstriated layer as illustrated in FIG. 6; in other embodiments, the conductor is striated into filaments. As shown in FIG. 5, in a FCL application, a mesh type covering 50 is preferably oriented with longitudinal mesh wires made of high resistivity material 52 disposed parallel to the direction of current flow in the conductor, and mesh wires made of a high thermal conductivity material 54 disposed transverse to the current flow. FIG. 6 shows a cross sectional view of the mesh covering on the superconductor 62 disposed on a substrate 64, covered with a buffer layer 65, a cap layer 66, and soldered to the mesh 50 with a high resistivity solder 68. The high resistivity longitudinal wires 52 are made from a material having a resistivity selected to limit current flow in the conductor. In a preferred embodiment, the longitudinal mesh wires 52 are made of 316 stainless steel; other materials, such as NiCr, monel, brass, Inconel, or Incoloy may also be used. In order to provide sufficient resistive load to limit current in a fault condition, it is desirable that a material selected for the longitudinal mesh wires 52 has a resistivity in the range of about 100-1200 n$\Omega$m. The transverse mesh wires 54 are preferably made from a material having a thermal conductivity high enough to provide efficient cooling of the superconductor when the fault condition occurs, and current is flowing through the longitudinal wires 52 of the mesh. In one embodiment, the transverse mesh wires 54 are made of copper; other materials, such as aluminum, copper-niobium, copper-silver, oxide dispersion strengthened copper, and high thermal conductivity copper and aluminum alloys may be used. In order to provide efficient cooling in a fault condition, it is desirable that a material selected for the transverse mesh wires 54 have a thermal conductivity of at least 500 W/m-K in the operating temperature range of 90K or lower. The ends of the transverse mesh wires 54 are preferably connected to a heat sink to provide a means for removing heat transported along the transverse mesh wires 54 from the longitudinal mesh wires 52, which can generate considerable heat in the event of a fault condition.

In other embodiments the invention, an anisotropic stabilizer suitable for FCLs, can include a binary elemental structure such as copper-niobium or copper-stainless steel can be used. Such mixtures can be made using powder metallurgy, and made into foil with different properties in the longitudinal and transverse directions by a combination of rolling and cross-rolling. For example, a long stainless steel tube can be filled with a mixture of approximately 70% by volume stainless steel powder, and approximately 30% by volume copper powder. The tube can then be evacuated and sealed, and drawn to a particular size. The tube can then be rolled in a manner that favors lateral spread rather than elongation, so that the copper particles preferentially spread sideways rather than elongate in a direction along the length of the tube. The resulting sheet would be expected to include a continuous matrix of stainless steel with copper threads extending in the transverse direction. Such a sheet, or foil, has a high resistivity in the length direction and good thermal conductivity in a direction substantially transverse to the length direction.

Figure 7:
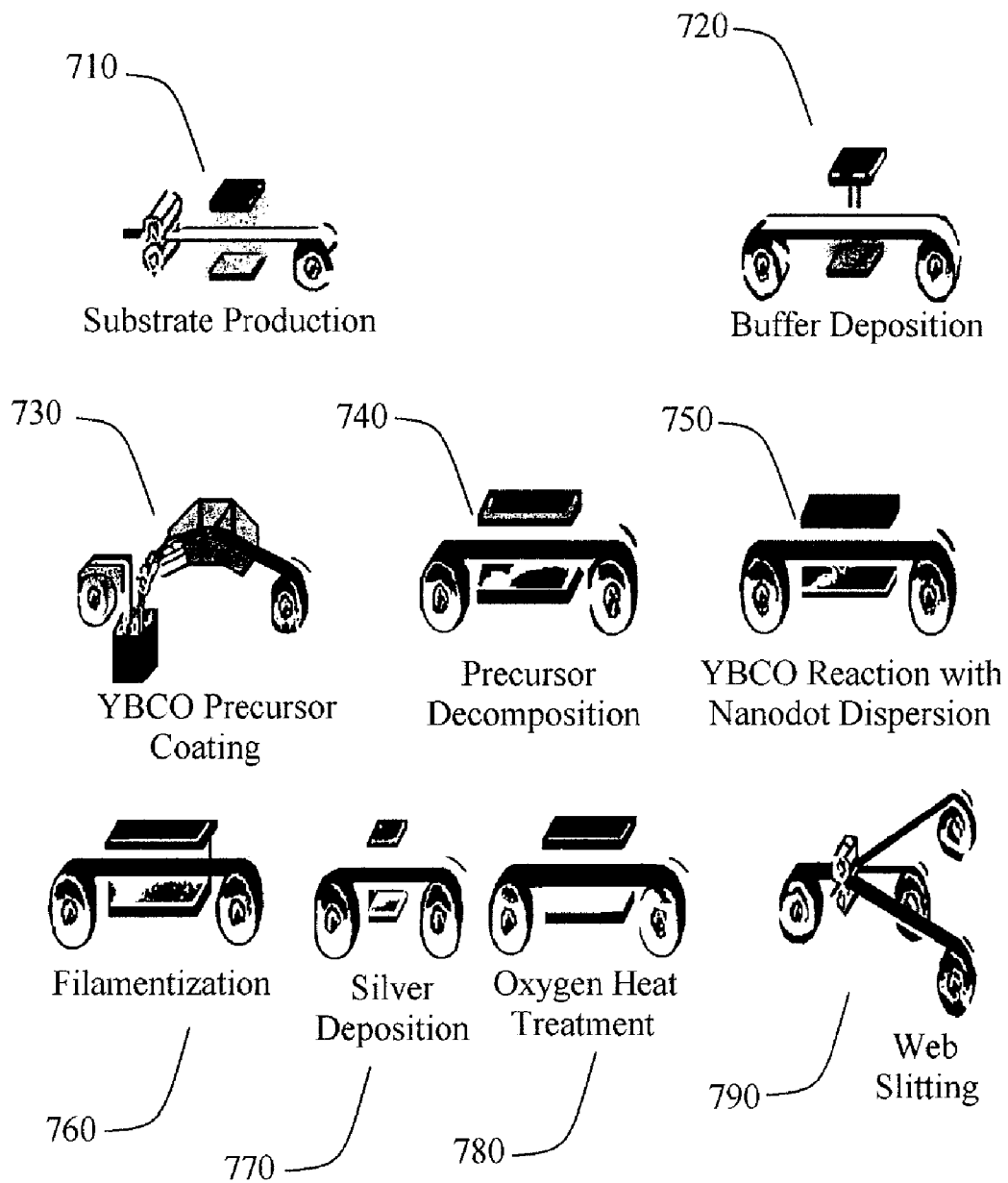
FIG. 7 is a schematic illustration of a system and process used to prepare a textured, patterned, and stabilized superconductor wire according to one or more embodiments of the present invention.

FIG. 7 illustrates a flow diagram of an exemplary process used to manufacture a mesh-stabilized filamentary superconductor according to various embodiments of the present invention. At a first station 710, a wire substrate is treated to obtain biaxial texture. Preferably, the substrate surface has a relatively well defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of the surface have a FWHM of less than about 20° (e.g., less than about 15°, less than about 10°, or from about 5° to about 10°).

The surface can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a wire or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quarternary alloy). In some of these embodiments, the alloy can contain one or more oxide formers (e.g., Mg, Al, Mo, V, Ta, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g., annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g., Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the intermediate layer. The sulfur can be formed on the surface of the intermediate layer, for example, by exposing the intermediate layer to a gas environment containing a source of sulfur (e.g., $H_2S$, a tantalum foil or a silver foil) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about $1\times10^{-3}$ torr, less than about $1\times10^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., S c(2×2)) can be formed by applying an appropriate organic solution to the surface of the intermediate layer by heating to an appropriate temperature in an appropriate gas environment.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

In a second processing station 720, a buffer layer is formed on the textured substrate by epitaxial growth on a textured metal surface. Alternatively, a buffer layer can be formed on a polycrystalline, randomly textured metal surface using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527. In certain embodiments, solution coating processes can be used for epitaxial deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors).

Once the textured substrate including buffer layers is prepared, a patterned precursor solution is deposited deposition station 730 as described above. Additional equipment may be required to accomplish the patterning operation, for example, when laser ablation or ion bombardment are used to pattern the superconducting layer. If dropwise patterned deposition is used, then a single station equipped with a inkjet printer deposition apparatus can accomplish both deposition and patterning of the oxide precursor solution.

At a subsequent station 740, the precursor components are decomposed. The conversion of the patterned precursor components into an oxide superconductor is carried out as has been previously reported for continuous thick precursor films. In the case of precursor components including at least one fluoride-containing salt, the first step of the heating step is performed to decompose the metalorganic molecules to one or more oxyfluoride intermediates of the desired superconductor material.

Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 Torr to about 50 Ton, more preferably at from about 5 Ton to about 30 Ton, and most preferably at from about 20 Ton to about 30 Torr. The partial pressure of oxygen in the nominal gas environment is maintained at from about 0.1 Ton to about 760 Ton and preferably at about 730-740 Ton.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Ton to about 25 Ton water vapor). The nominal partial pressure of oxygen can be, for example, from about 0.1 Ton to about 760 Ton. In these embodiments, heating is then continued to a temperature of from about 220° C. to about 290° C. (e.g., about 220° C.) in a water vapor pressure of from about 5 Ton to about 50 Ton water vapor (e.g., from about 5 Ton to about 30 Ton water vapor, or from about 10 Ton to about 25 Ton water vapor). The nominal partial pressure of oxygen can be, for example, from about 0.1 Ton to about 760 Torr. This is followed by heating to about 400° C. at a rate of at least about 2° C. per minute (e.g., at least about 3° C. per minute, or at least about 5° C. per minute) in a water vapor pressure of from about 5 Ton to about 50 Ton water vapor (e.g., from about 5 Ton to about 30 Ton water vapor, or from about 10 Ton to about 25 Ton water vapor) to form barium fluoride. The nominal partial pressure of oxygen can be, for example, from about 0.1 Ton to about 760 Ton.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Ton, a predetermined partial pressure of water vapor (e.g. at least about 10 Ton, at least about 15 Ton, at most about 25 Ton, at most about 20 Ton, about 17 Ton) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

The superconductor intermediate film can then be heated to form the desired superconductor layer at a further processing station 750. Typically, this step is performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 Ton to about 760 Ton and is comprised of about 0.09 Ton to about 50 Ton oxygen and about 0.01 Ton to about 150 Ton water vapor and about 0 Ton to about 750 Ton of an inert gas (nitrogen or argon). More preferably, the nominal gas environment has a total pressure of about 0.15 Ton to about 5 Ton and is comprised of about 0.1 Ton to about 1 Ton oxygen and about 0.05 Ton to about 4 Ton water vapor.

The film is then held at a temperature of about 700° C.-825° C., preferably to a temperature of about 740° C. to 800° C. and more preferably to a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 Ton to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Ton to about 5 Ton and is comprised of about 0.1 Ton to about 1 Ton oxygen and about 0.05 Ton to about 4 Ton water vapor.

The film is then cooled to room temperature in a nominal gas environment with an oxygen pressure of about 0.05 Ton to about 150 Ton, preferably about 0.1 Ton to about 0.5 Ton and more preferably from about 0.1 Ton to about 0.2 Ton.

Filamentization can be performed at station 760 by known processes, or by processes described in U.S. patent application Ser. No. 10/955,801, filed on Sep. 29, 2004. Further processing by noble metal deposition at station 770, oxygen annealing at station 780, and slitting at station 790 complete the process.

INCORPORATION BY REFERENCE

The following documents are hereby incorporated by reference: U.S. Pat. No. 5,231,074, issued on Jul. 27, 1993, and entitled "Preparation of Highly Textured Oxide Superconducting Films from MOD Precursor Solutions," U.S. Pat. No. 6,022,832, issued Feb. 8, 2000, and entitled "Low Vacuum Process for Producing Superconductor Articles with Epitaxial Layers," U.S. Pat. No. 6,027,564, issued Feb. 22, 2000, and entitled "Low Vacuum Process for Producing Epitaxial Layers," U.S. Pat. No. 6,190,752, issued Feb. 20, 2001, and entitled "Thin Films Having Rock-Salt-Like Structure Deposited on Amorphous Surfaces,' PCT Publication No. WO 00/58530, published on Oct. 5, 2000, and entitled "Alloy Materials," PCT Publication No. WO/58044, published on Oct. 5, 2000, and entitled "Alloy Materials," PCT Publication No. WO 99/17307, published on Apr. 8, 1999, and entitled "Substrates with Improved Oxidation Resistance," PCT Publication No. WO 99/16941, published on Apr. 8, 1999, and entitled "Substrates for Superconductors," PCT Publication No. WO 98/58415, published on Dec. 23, 1998, and entitled "Controlled Conversion of Metal Oxyfluorides into Superconducting Oxides," PCT Publication No. WO 01/11428, published on Feb. 15, 2001, and entitled "Multi-Layer Articles and Methods of Making Same," PCT Publication No. WO 01/08232, published on Feb. 1, 2001, and entitled "Multi-Layer Articles And Methods Of Making Same," PCT Publication No. WO 01/08235, published on Feb. 1, 2001, and entitled "Methods And Compositions For Making A Multi-Layer Article," PCT Publication No. WO 01/08236, published on Feb. 1, 2001, and entitled "Coated Conductor Thick Film Precursor", PCT Publication No. WO 01/08169, published on Feb. 1, 2001, and entitled "Coated Conductors With Reduced A.C. Loss" PCT Publication No. WO 01/15245, published on Mar. 1, 2001, and entitled "Surface Control Alloy Substrates And Methods Of Manufacture Therefor," PCT Publication No. WO 01/08170, published on Feb. 1, 2001, and entitled "Enhanced Purity Oxide Layer Formation," PCT Publication No. WO 01/26164, published on Apr. 12, 2001, and entitled "Control of Oxide Layer Reaction Rates," PCT Publication No. WO 01/26165, published on Apr. 12, 2001, and entitled "Oxide Layer Method," PCT Publication No. WO 01/08233, published on Feb. 1, 2001, and entitled "Enhanced High Temperature Coated Superconductors," PCT Publication No. WO 01/08231, published on Feb. 1, 2001, and entitled "Methods of Making A Superconductor," PCT Publication No. WO 02/35615, published on Apr. 20, 2002, and entitled "Precursor Solutions and Methods of Using Same," U.S. Pat. No. 6,436,317, filed on Aug. 20, 2002, and entitled, "Oxide Bronze Compositions And Textured Articles Manufactured In Accordance Therewith;" and U.S. Provisional Patent Application Ser. No. 60/309,116, filed on Jul. 31, 2001, and entitled "Multi-Layer Superconductors And Methods Of Making Same;" U.S. Pat. No. 6,797, 313, filed on Sep. 28, 2004, and entitled "Superconductor Methods and Reactor;" and U.S. Provisional Patent Application Ser. No. 60/166,297, filed on Nov. 18, 1999, and entitled "Superconductor Articles and Compositions and Methods for Making Same;" and commonly owned U.S. Pat. No. 6,974, 501, filed on Dec. 13, 2005, and entitled "Superconductor Articles and Compositions and Methods for Making Same;" and U.S. Patent Publication No. 2005-0065035, published Mar. 24, 2005, and entitled "Superconductor Methods and Reactors;" and U.S. Patent Publication No. 2006-0040830, published on Feb. 23, 2006, and entitled "Low AC Loss Filamentary Coated Superconductors;" and U.S. patent application Ser. No. 10/955,801, filed on Sep. 29, 2004, and entitled "Stacked Filamentary Superconductors," all of which are hereby incorporated by reference.

The invention claimed is:

1. A current limiter comprising:
a substrate;
a superconducting layer disposed on the substrate; and
a covering disposed above the superconducting layer, the covering having anisotropic resistivity, the covering comprising a mesh comprising:
longitudinally disposed wires comprising a first conducting material having a resistivity in the range of 100 nΩm to 1500 nΩm at a temperature of approximately 77 degrees Kelvin, the longitudinally disposed wires in electrical communication with the superconducting layer, and
transversely disposed wires comprising a second conducting material having a thermal conductivity of at least 1000 W/m-K at a temperature of 77 degrees Kelvin, the transversely disposed wires disposed perpendicular to the longitudinally disposed wires.

2. The current limiter of claim 1, wherein the covering is in contact with the superconducting layer.

3. The current limiter of claim 1, wherein the mesh comprises wires having a diameter between 0.02 millimeters to 0.25 millimeters.

4. The current limiter of claim 1, wherein the first conducting material comprises at least one of stainless steel, a nickel alloy, a copper alloy, and an aluminum alloy, and the second conducting material comprises at least one of copper, aluminum, silver, a copper alloy, an aluminum alloy and a noble metal alloy, 5. The current limiter of claim 1, wherein the resistivity of the first conducting material is selected to carry a controlled and limited current along the longitudinally disposed wires in the event of a fault in a circuit that includes the superconducting layer, and the second conducting material is selected to effectively transport heat away from the longitudinally disposed wires in the event of a fault.

6. The current limiter of claim 1, wherein the covering comprises a sheet including a mixture of a first material having a resistivity selected to carry a controlled and limited current in the event of a fault in a circuit that includes the superconducting layer, and a second material having a thermal conductivity selected to effectively transport heat away from the first material in the event of a fault.

7. The current limiter of claim 6 wherein the second material comprises particles that are elongated in a direction perpendicular to the direction of current flow.

8. The current limiter of claim 1, wherein the superconducting layer comprises at least one of a monolithic superconducting layer and a plurality of superconducting filaments.

9. A method of making a current limiter, the method comprising:
depositing a superconducting layer on a substrate;
covering the superconducting layer with a medium having anisotropic resistivity, the medium being in electrical communication with the superconducting layer, the medium comprising a mesh comprising:
longitudinally disposed wires comprising a first conducting material having a resistivity in the range of 100 n$\Omega$m to 1500 n$\Omega$m at a temperature of approximately 77 degrees Kelvin, the longitudinally disposed wires in electrical communication with the superconducting layer, and
transversely disposed wires comprising a second conducting material having a thermal conductivity of at least 1000 W/m-K at a temperature of 77 degrees Kelvin, the transversely disposed wires disposed perpendicular to the longitudinally, disposed wires.

10. The current limiter of claim 1, further comprising a silver cap layer disposed above the superconducting layer.

* * * * *